United States Patent [19]
Snyder

[11] Patent Number: 4,829,405
[45] Date of Patent: May 9, 1989

[54] TAPE AUTOMATED BONDING PACKAGE

[75] Inventor: Keith A. Snyder, Vestal, N.Y.

[73] Assignee: International Business Machines Corporation, Armonk, N.Y.

[21] Appl. No.: 168,034

[22] Filed: Mar. 14, 1988

[51] Int. Cl.$^4$ ............................................. H05K 01/14
[52] U.S. Cl. .................................... 361/413; 361/398; 361/401; 361/414
[58] Field of Search ............... 361/407, 398, 401, 413, 361/414

[56] References Cited
U.S. PATENT DOCUMENTS

| | | | |
|---|---|---|---|
| 3,546,775 | 12/1970 | Lalmond et al. | 361/398 X |
| 3,684,818 | 8/1972 | Netherwood | 174/52 S |
| 3,875,479 | 4/1975 | Jagger | 361/414 |
| 4,064,552 | 12/1977 | Angelucci et al. | 361/398 X |
| 4,495,377 | 1/1985 | Johnson et al. | 174/68.5 |
| 4,694,123 | 9/1987 | Massey | 361/407 X |

FOREIGN PATENT DOCUMENTS 0164921  5/1985  European Pat. Off. ............ 361/414

Primary Examiner—R. R. Kucia
Attorney, Agent, or Firm—Douglas M. Clarkson

[57] ABSTRACT

The disclosure describes a new and improved Tape Automated Bonding package which admits of certain advantages that are not available with the packages as used in the past, and it overcomes some limitations with the previous packages which permits a significant step forward in realizing these advantages.

Briefly, the disclosure describes a division of the dielectric support used to package integrated circuit chips in order to separate the power conductors and the signal conductors into different parts of the support. The conductors formed on at least one of these parts, preferably the part used to connect input/output signals to and from a chip, are arranged in radially extending rows to achieve more than twice the number of such connections.

9 Claims, 3 Drawing Sheets

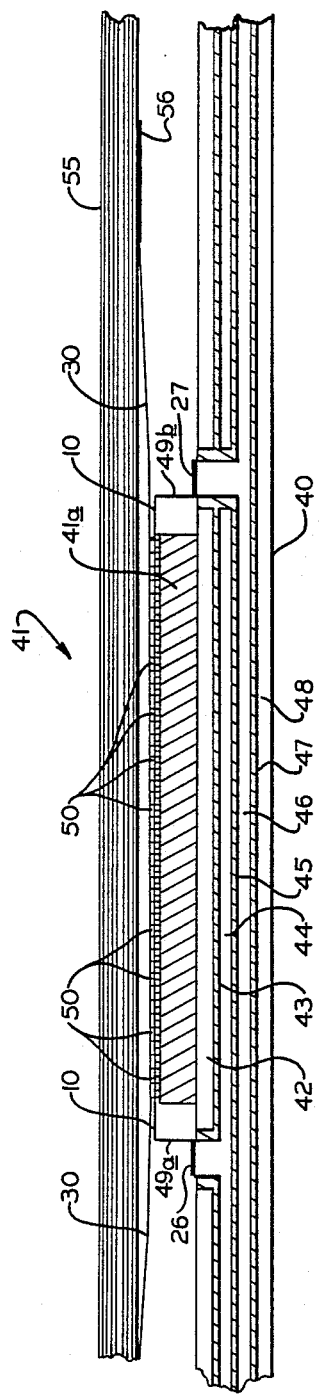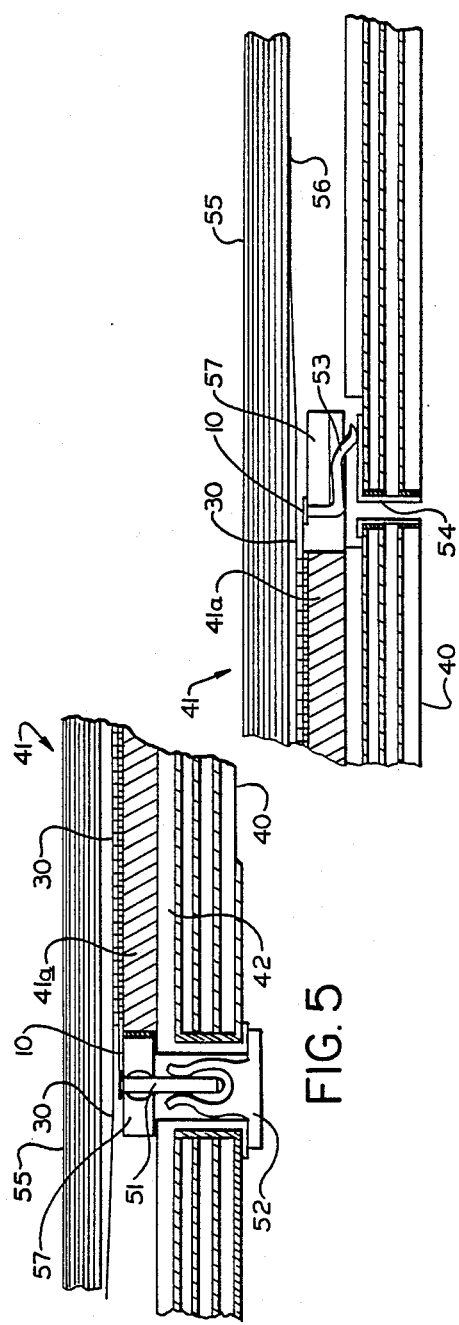

TAPE AUTOMATED BONDING PACKAGE

TECHNICAL FIELD

The present invention relates to the packaging of electronic components using Tape Automated Bonding (TAB) techniques and, more particularly, to such an improved arrangement as to permit significant advantages.

BACKGROUND

A technique known in the Electronic Packaging industry as "Tape Automated Bonding" (or "TAB") has extended the performance of electronic integrated circuits dramatically because it permitted, for the first time, a way to control impedance that resulted from the previous bonding techniques, and also, it reduced substantially the electrical "noise" that resulted from the previous bonding techniques.

This TAB technology has been somewhat of an industry standard for several years now. Nevertheless, at least a brief description of what it involves appears advisable to permit a clear and a full understanding of the improvement that is provided by the present invention.

Prior Tape Fabrication

Prior to the introduction of the TAB technology, however, small wires, approximating the thickness of a human hair, were used to connect to, and from, the very small integrated circuit chips to which the electronic industry had advanced. This was a difficult process, and it required the exercise of great care and very expensive equipment in order to automate it. It has been practiced for years now in the industry, and it has been modified and improved from time to time.

However, when the Tape Automated Bonding technique was introduced, it provided a dramatic improvement. It involves the use of a polymer film, such as those known commercially under the trade names Tedlar, Kapton or Mylar, formed in long lengths (thus the word "Tape") with openings repeated along its length, the openings having a predetermined shape that depends upon, for example, the shape of the integrated circuit chip to be fitted and connected therein. A plurality of small holes is arrayed about each opening in the tape in a pattern that depends upon the connections to be made to the integrated circuit card or module substrate. To form the conductors from each of these small holes, a thin foil of electrically conductive metal is laminated to the surface, extending to the edge of the tape.

These holes in the tape usually are formed by laser cutting, mechanical punching or chemical milling, but they can be formed by any process that may be found to be appropriate. The thin foil of metal is laminated to the polymer film by processes and adhesives that are appropriate to the particular film material selected. The metal foil, usually, is solid, having no preformed holes or openings, except any that may be required for the processing.

By using one of the customary photoresist processes, excess metal is etched from the foil, leaving metal in the locations where conductors are needed and spaces where spaces are needed, all in accordance with a circuit design that is predetermined. Also left by the photo etching process is one or more free cantilevered leads over each hole in the polymer film.

Those parts of the metal foil that are unprotected from the back, or reverse side, during a subsequent etching process, will have a layer of etch resist material applied in order to protect them as well. An example of such parts are those areas extending over the small holes. Of course, this etch resist material is removed after the etching is completed to expose the electrically conductive metal for connecting to other component parts or to other external circuitry.

Further details of the photoresist process are not believed to be necessary because it is a process that is widely used in industry today and is thoroughly understood. In addition, it is not the only process used or available in industry for this purpose. When one of the several additive processes is used, the formation of holes in the polymer film is a last process step and is done usually by photo chemical etching or milling. Laser ablation also is available for the purpose of forming these holes.

Regardless of the process selected to form the conductors on the polymer film, a "bump" is needed on the end of each conductor that terminates at the central opening. Of course, the "bump" can be formed on the conductor termination (usually in the form of a "pad") that is on the integrated circuit chip, if that becomes more convenient. There are several processes just for the purpose of forming these "bumps" on conductors, and they are well known to those skilled in this art.

Chip and Tape Assembly

The assembly of a small electronic integrated circuit chip within an opening in the dielectric tape involves the positioning of the chip within the opening and using a hot thermode to press a wire that overhangs a hole in the polymer tape into firm and deforming contact with the matching connection pad that has been prepared for this purpose on the chip, either one of which may have the "bump", as described above. Of course, any number or all of the connections can be made at one time by appropriate adjustments in the size and configuration of the thermode. The thermode accomplishes the bonding by applying pressure and heat for a short duration.

After the bonds have been completed, it is customary to encapsulate the connections thus formed on the integrated circuit chip by dispensing a suitable polymeric material that hardens in place and adds strength to the assembly to reduce the chance of damage during later use.

The conductor leads that overhang the outer edges of the dielectric tape are bonded to other conductors or to other component parts by the use of various suitable processes. For example, one process uses a hot knife, another involves vapor phase heating, while still another process uses radiant heating.

As has been stated previously hereinabove, the Tape Automated Bonding technique has provided a significant advancement in the art of packaging of the larger and higher density components to which the electronic industry is moving today with ever increasing speed. However, it seems that every such advancement has limits, and while some of the problems that are being experienced today may not be termed "limits", they are accurately termed "problems". And the TAB technique has not permitted the hoped-for answers.

One such problem concerns a needed increase in the number of conductor leads in order to provide more input/output (I/O) connections. Making changes in the arrangement and size of the connection pads has permitted some increase, but further increases are needed.

Another problem concerns a growing need to increase the electrical power to and from these chips, as their complexity increases. For example, the power needs for some of the newer technology chips can run as high as 50 watts. At a voltage of 5 volts, and lower, the required electrical current in a conductor the size of a human hair may produce results that are entertaining, but they are neither economical nor practical.

With the I/O connections already arranged tightly and with the trend toward ever increasing current flow, it can be expected that the cross-talk, or other interference, between conductors will increase also. This would be still another problem to which no answer is available by the current TAB technique.

DESCRIPTION OF THE PRIOR ART

U.S. Pat. No. 4,495,377 which issued on Jan. 22, 1985 to Johnson, et al. and which is assigned to the same assignee as the present invention, describes a wiring pattern to achieve what is stated in the patent as being the maximum number of input/output connections that is "possible" for a given conductor pitch and DNP. The wiring pattern described involves arranging the input/output connection pads and linear conductors in a plurality of wedge-shaped segments with radial edges and outer edges.

However, with a technique in accordance with the present invention, all of the above-identified problems are solved readily, plus providing for a substantial increase in the number of input/output connections and a complete isolation of power connections from the signal leads. Therefore, the limitation stated in the prior art U.S. Pat. No. 4,495,377 is overcome and surpassed by the present invention.

OBJECTS AND SUMMARY OF THE INVENTION

Accordingly, it is a principal object of the present invention to provide a structural arrangement and technique that admits of an increase in the number of I/O connections over that previously possible.

It is also an important object of the present invention to provide a structural arrangement and technique that admits of a separation of power and signal distribution planes from each other.

Briefly, an improved Tape Automated Bonding package in accordance with the present invention divides the leads that provide input/output connections for an electronic chip into two groups and provides support for the two groups of leads in a predetermined spaced-apart relationship. Connections between pads on an integrated circuit chip and conductors on a dielectric tape are made much easier, because such connections are not limited to perimeter arrangements.

The above and other objects, features and advantages of the present invention will become more readily apparent from the following detailed description of the presently preferred form of the invention, as illustrated in the accompanying drawings.

BRIEF DESCRIPTION OF THE DRAWINGS

FIG. 4 is a view in cross section elevation of an assembly in accordance with the presently preferred form of the invention.

FIG. 5 is a view in cross section elevation of a modification to which the invention is adaptable.

FIG. 6 is a view in cross section elevation of another modification to which the invention is readily adaptable also.

BEST MODE FOR CARRYING OUT THE INVENTION

Figure 1:
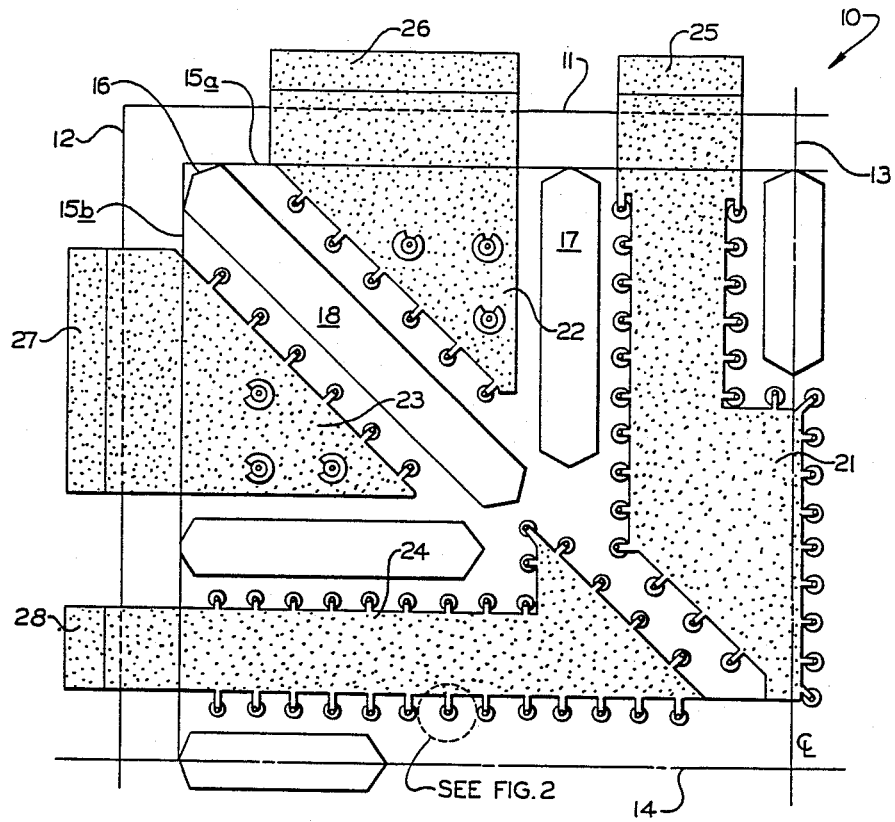
FIG. 1 is an illustration of one quartile of one layer of a dielectric tape with power connections arranged in accordance with the present invention.

In FIG. 1 of the drawings, the numeral 10 identifies, generally, one quartile of a power panel of electrically non-conductive (dielectric) support material, with 11 identifying an edge and 12 identifying another edge. The numerals 13 and 14 identify respective centerlines. The lines 15a and 15b mark the location of where a chip 16 is to be located when packaged with, and bonded to, the respective terminals, as will be described in more detail presently.

The panel 10 is electrically non-conductive, or dielectric, and preferably is formed in individual panels with openings, or cut-outs, such as polygons 17 and 18 for example, and small circular holes 19 formed at locations determined by the design of the circuit on the chip 16 to be attached. Large areas of electrically conductive material form "lands" 21, 22, 23 and 24.

Figure 2:
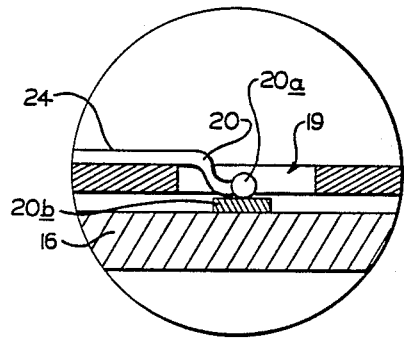
FIG. 2 is an enlarged view in elevation of that portion of FIG. 1 enclosed within a circle.

Each of these lands have two means of connection, one means is, as best seen in FIG. 2: in each of the small circular holes, such as the hole 19 for example, there is a short lead 20 from the adjacent land, such as the land 24, with a bump 20a to bond the lead 20 to a pad 20b on the chip 16, as will be described in more detail, infra.

The other means of connection to a land is as follows: each land has a larger part: 25, 26, 27 and 28, respectively, that is formed at an angle for connection to a multilayer power distribution panel 40, FIG. 4, in accordance with the invention and as will be described in more detail also hereinafter.

An example of the use of each of these larger lands of conductive material is as follows: the land 21 can serve to connect the terminals that are attached to it to a ground, the land 22 can be used to connect to a voltage $V_1$ by means of the connection part 26, the land 23 can be connected to a voltage $V_2$ and the land 24 can be for a voltage $V_3$.

Figure 3:
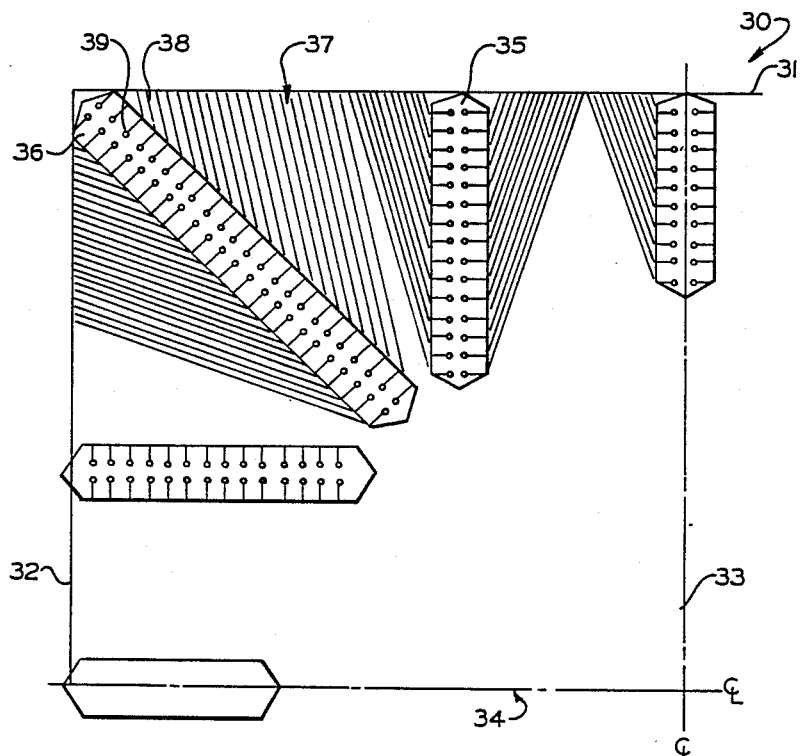
FIG. 3 is an illustration of one quartile of another layer of a dielectric tape with connections to conduct signals to and from a chip in accordance with the invention.

FIG. 3 of the drawings shows a one quartile section of a separate wiring panel also formed of an electrically non-conductive (dielectric) support material, such as a polyimide, that is identified generally by the reference numeral 30. The lines 31 and 32 identify outlines of two sides of a chip to be attached, and the lines 33 and 34 are the center-lines beyond which the panel of dielectric material, and the chip, extend. Each of the polygon openings in the panel 30 match in configuration and in location the polygon openings in the power panel 10. For example, the openings 35 and 36 in FIG. 3 match the openings 17 and 18 in FIG. 1.

While each one of a plurality of conductors 37 extend beyond the boundaries indicated by the lines 31 and 32, the opposite end terminates at ends that are cantilevered out over the respective polygon openings in the panel 30. For example, the conductor 38 terminates at an end 39 in FIG. 3, and each one of these ends may be enlarged to form a "bump", like the bump 20a in FIG. 2, to aid in subsequent bonding by thermal compression bonding to an unbumped chip pad.

The polygon openings, such as the openings 35 and 36 in the dielectric panel 30, are of a design configuration to approximate the integrated circuit chip to be fitted and bonded to the conductor ends, like the end 39, extending in a cantilevered manner over the opening 36. Both of the panels illustrated in FIG. 1 and in FIG. 3 are formed from a suitable electrically non-conductive, or dielectric, material, such as one of the polymer materials that are available commercially under the trade names Tedlar, Kapton or Mylar.

On the dielectric material, the plurality of conductors 37 are arranged according to a predetermined circuit design and are formed by laminating a foil of suitable electrically conductive material, such as copper that is about ½ oz. in weight, by any of the processes available that are appropriate for the particular material selected. By using an etch resist material applied over those areas of the conductive foil where the conductors are to be formed and by etching away all of the rest of the foil, the plurality of conductors 37 are formed with the spaces between adjacent conductors, as shown in the drawings, particularly in FIG. 3.

The cantilevered ends, such as the end 39 in FIG. 3, can be formed by this etching process also, but the foil that overhangs the polygon openings must be protected on the portions overhanging the openings by a blanket application of the etch resist material to the reverse side of the overhang portion. This avoids the etching of the copper foil from the unprotected back. After the etching process is completed, the etch resist material is removed to leave a conductive surface.

Therefore, according to the present invention, the conductors for connecting various voltages, including ground, are arranged on one electrically non-conductive support panel and the conductors for connecting electrical signals to and from a small chip are arranged on a second electrically non-conductive support panel. With the two component panels of a Tape Automated Bonding (TAB) system formed in this manner, the conductor leads on these two separate panels must now be bonded to pads on a chip.

The use of the TAB technique to join the panels, constructed according to the invention, is accomplished by the use of a hot thermode to press the TAB wire that is over an opening 36 in the polymer I/O panel 30 into firm and deforming contact with the matching connection pad on the chip, either the wire end or the pad being formed with a raised bump, such as the bump 30 in FIG. 2. As described hereinabove, one of the advantages of the TAB technology is that all of these connections on one layer of the TAB panel can be bonded at one time by the use of a thermode of sufficient size to cover all of the connections at one time and in one stroke of the thermode.

An arrangement according to the invention permits the power panel 10 shown in FIG. 1 to be bonded to a chip first. Then, the I/O panel 30 shown in FIG. 3 is bonded to the chip by the use of a hot thermode with a face that is configured to press only on the new bonds to be made at this time. This is accomplished by creating raised areas on the thermode face that are about 0.1 to 0.2 mm high, at least, in a pattern similar to the hole pattern in the panel 10. The bonds formed now, at this point, are accomplished by reaching through the large polygon opening 18 in the power panel 10. Of course, the particular sequence that the various bonds are made is dictated by, for example, the particular arrangement of the conductors on the respective panels 10 and 30, as will be understood by one skilled in this art.

FIG. 4 of the drawings illustrates in vertical section an integrated circuit chip 41a bonded in place to the power panel 10 (FIG. 1), to the input/output panel 30 (FIG. 3), to a multilayer power distribution panel 40 (FIG. 4) and to a multilayer input/output distribution panel 55. This complete package of input/output connections, power lead connections and the integrated circuit chip 41a is identified by the numeral 41 in FIG. 4 of the drawings.

The panel 10, as viewed in FIG. 4, is illustrated in more detail in FIG. 1, and the panel 30, as viewed in FIG. 4, is illustrated in more detail in FIG. 3. While the various lands 21, 22, 23 and 24 in FIG. 1 are connected to any desired voltage or to ground in the multilayer power distribution panel 40 through their respective offset parts 25, 26, 27 and 28, only the parts 26 and 27 are visible in FIG. 4.

The two offset parts 26 and 27 have vertical sections 49a and 49b, respectively. Any number of reflow solder offset parts, like these parts 26 and 27, can be provided for connecting a chip pad to any voltage available in the multilayered power distribution panel 40, or to ground. Moreover, these reflow solder offset parts can be located anywhere they are needed, as determined by the circuit.

In FIG. 4, the ground land 42 is illustrated as being the top level, with an intermediate level 43 of insulation material. A land 44 is shown separated by a layer 45 of insulation from another land 46, and a layer of insulation 47 is shown between the land 46 and a third land 48. Of course, there can be any needed number of lands, but the four shown can connect a circuit to different voltages $V_1$, $V_2$, $V_3$ and to ground.

Hardly visible in this view are several bonds 50 that connect respective ends, such as the cantilevered end 39 in FIG. 3, to corresponding pads on the integrated circuit chip 41a. The end 39 of the conductor 38 is identified as one of the ends involved in such a bonded connection 50, the other being the pad on a chip (not shown in FIG. 3 but located on the integrated circuit chip 41a in FIG. 4).

FIG. 5 shows a modification of the parts 25, 26, etc. and is a pin 51 connected to one of the lands on the power panel 10. A spring receptacle 52 is positioned and attached to the multilayer power distribution panel 40 to connect, for example, the ground 42 to the pin 51 when the pin 51 is plugged in. There are instances when it is desirable to have the multilayer power distribution panel 40 detachable readily from the integrated circuit chip package 41.

FIG. 6 shows another modification of such an attachment that is readily detachable also. In this arrangement, a contact spring 53 is positioned and attached to the power panel 10 to connect with a contact terminal 54 that is connected to the voltage land 46 (FIG. 4 of the drawings).

In summary, an attachment between respective conductor leads is accomplished by any of several techniques, such as:

(1) The offset parts 26, 27, etc. on the power panel 10 as shown in FIG. 4 are pre-tinned and reflow soldered to the terminals on the power distribution panel 40 for which they are designed. Reflow soldering is performed best in an oven or vapor phase soldering machine with suitable fixturing in place and followed by cleaning to remove flux residue. The solder used here must melt at a temperature lower than that used for any previous outer lead bonding that may be involved.

(2) A frame 57 can be assembled to the chip that carries connector pins that will engage mating spring receptacles mounted as shown in FIG. 5. FIG. 5 involves a frame and a pin mounted in the frame with the power panel 10 bonded to the head of the pin, and now it is pluggable by pin connections to a receptacle that is mounted by solder to a plated through hole. The frame preferably is assembled to the chip prior to the attachment of the first panel (FIG. 1) and the outer lead bonding of the power panel conductors to the pins should precede the assembly with the I/O panel 30. Such bonding preferably is made by soldering, but welding and mechanical clamping are entirely acceptable as alternate forms of attachment.

(3) The frame 57, mentioned above, may contain spring contacts that engage suitably prepared contact pads on the surface of the power distribution panel 40 as shown in FIG. 6. The outer lead bonding of the conductors on the input/output panel 30 is made, as at 56, by any soldering or welding means that is suitable, to the signal wiring assemblies. All of these alternative modifications result in the integrated circuit chip 41a being located between two multilayer printed circuit cards.

There is an additional modification, according to the present invention, that does not require a second assembly step for carrying electrical power to an integrated circuit chip, such as the chip 41a. By forming the power panel 10 so that it extends beyond the outer dimensions of the I/O panel 30 and by providing the power panel 10 with means to permit the outer lead bonding of the I/O panel 30 first to multilayer panel 55 with both signal and power conductors (there is no power distribution panel 40 in this modification), then the bonding of the lands, on the power panel 10 that are further out, to power terminals of the power conductors on the same panel 55 can be accomplished readily, provided, of course, that the active face of the integrated circuit chip 41a is closest to the multilayer panel 55. This modification requires that the panel 55 contain both the usual signal and power distribution conductors, as will be readily understood by one skilled in this art.

If back bonding or attachment of the chip to a single printed wiring card is desired, then the input/output panel 30 would have to extend beyond the power panel 10 and the panel 10 is the first to be attached to the card.

Having described the invention in substantial detail, there are alterations and modifications that will occur to one skilled in this art. For example, while the use of two complete and separate multilayered assemblies are described and is the presently preferred construction, other forms, constructions and arrangements of the invention could be devised using only one piece of insulating film with two levels of metal conductors bonded on opposite sides to achieve at least part of the benefits and advantages of the presently described embodiment.

There are other advantages available with an arrangement in accordance with the invention, whether the particular embodiment of the invention as described is used or one of the other forms that flow from it. By way of example, the radial pattern of the input/output pads make connection to many more I/Os than is possible with conventional, previously known perimeter patterns. The arrangement shown in FIG. 3 of the drawings permits 496 I/Os on 0.1 mm centers in paired rows on a 7×7 mm chip, while an arrangement in a perimeter pattern permits only 268 I/Os using the same 0.1 mm center pitch dimension.

Another advantage admitted by the arrangement of the invention involves the power panel shown in FIG. 1 of the drawings. It has much lower inductance and resistance than is possible when space for these conductors must be found on the same level with the I/O conductors, as done according to the prior art.

One of the more important advantages available from the arrangement of the invention is that the separation of the signal conductors from the power conductors is possible now at the next level of wiring, which permits a dramatic improvement in power distribution. This has been described previously hereinabove in more detail, but still another advantage has been found to flow from this separation feature. That is, it permits somewhat more simplified production processes used in making the circuit cards or boards.

Yet another advantage is permitted by the arrangement in accordance with the invention. It is an advantage that is permitted by the separation of power and signal conductors into layers bonded on opposite sides of an integrated circuit chip. Now it is possible, using printed wiring processes known today, to interconnect chips on organic carriers at densities that are comparable to those attained on other types of carriers.

A further advantage of the invention flows from the arrangement of the conductors in radial rows, which permits the connection of more than twice the number of input/output connections from an integrated circuit chip, compared to the number of connections using C4 technology and conductor line widths of one mil or more.

Having described the invention completely with reference to the presently preferred embodiment, it will be apparent to those skilled in this art that modifications and changes can be made, but it is understood that all such modifications and changes that come within the spirit and scope of the claims appended hereto are within the present invention.

What is claimed is:

1. A Tape Automated Bonding package to obtain a substantial increase in number of input/output connections for packaging an integrated circuit chip, and to obtain a separation of power distribution from such input/output connections used for signals, comprising:

first dielectric means supporting lands of electrically conductive material in a predetermined pattern with terminals for bonding to said integrated circuit chip, and defining openings therein;

second dielectric means supporting a pattern of electrically conductive leads with ends for bonding to pads on said integrated circuit chip, and defining openings over which said ends extend;

power distribution panel means, separate from said first and second dielectric means, for supplying power to said integrated circuit chip through lands of electrically conductive material supported by said first dielectric means; and a multilayer printed circuit panel for providing support for said second dielectric means;

so that a package will comprise said multilayer printed circuit panel, said second dielectric means, said first dielectric means, said integrated circuit chip, and said power distribution panel means.

2. A Tape Automated Bonding package according to claim 1 wherein said power distribution panel means is formed of multilayers with lands of electrically conductive material separated by electrically non-conductive material, and means for connecting predetermined lands on said power distribution panel means to predetermined lands supported by said first dielectric means.

3. A Tape Automated Bonding package according to claim 1 including two multilayer printed circuit panels, one of said multilayer printed circuit panels being located for providing support for said second dielectric means; and the other of said two multilayer printed circuit panels being formed by said power distribution panel means, so that said integrated circuit chip is located between said two multilayer printed circuit panels to provide separation between power distribution means and input/output signal means.

4. A Tape Automated Bonding package according to claim 1 including means to form electrical connections between predetermined lands on said power distribution means and predetermined lands supported by said first dielectric means.

5. A Tape Automated Bonding package according to claim 4 wherein said means to form electrical connections includes readily detachable connection means.

6. A Tape Automated Bonding package according to claim 5 wherein said detachable connection means includes pin and spring receptacle means.

7. A Tape Automated Bonding package according to claim 5 wherein said detachable connection means includes spring contact means attached to a land supported by said first dielectric means located to form an electrical contact with terminal means attached to a land on said power distribution panel means.

8. A Tape Automated Bonding package according to claim 1 wherein said openings defined by said first dielectric means are located relative to said openings defined by said second dielectric means so that access to said lead ends extending there over is available for bonding to corresponding pads on said integrated circuit chip.

9. A Tape Automated Bonding package according to claim 1 wherein said lands of electrically conductive material supported by said first dielectric means includes parts extending over the edge of said dielectric material and bent in the direction of said power distribution panel for bonding to predetermined lands on said power distribution panel so that said lands supported by said first dielectric means perform as power connections between said power distribution panel means and said integrated circuit chip.

* * * * *